United States Patent [19]
Simpson

[11] Patent Number: 5,245,214
[45] Date of Patent: Sep. 14, 1993

[54] METHOD OF DESIGNING A LEADFRAME AND A LEADFRAME CREATED THEREBY

[75] Inventor: Reginald R. Simpson, Nepean, Canada

[73] Assignee: Northern Telecom Limited, Montreal, Canada

[21] Appl. No.: 710,996

[22] Filed: Jun. 6, 1991

[51] Int. Cl.[5] ............................................. H01L 23/48
[52] U.S. Cl. .................................... 257/666; 257/670; 257/692; 257/786; 437/220
[58] Field of Search ............................ 357/70, 74, 65; 257/666, 668, 670, 671, 692, 786; 174/52.4; 437/220

[56] References Cited
U.S. PATENT DOCUMENTS

| | | | |
|---|---|---|---|
| 4,901,136 | 2/1990 | Neugebauer et al. | 357/70 |
| 4,918,512 | 4/1990 | Owens | 357/70 |
| 5,045,919 | 9/1991 | Nagaoka | 357/70 |
| 5,061,822 | 10/1991 | Spielberger | 357/70 |

FOREIGN PATENT DOCUMENTS
0180059 7/1990 Japan .

*Primary Examiner*—William Mintel
*Assistant Examiner*—Roy Potter
*Attorney, Agent, or Firm*—John E. Mowle

[57] ABSTRACT

A leadframe comprises interconnect leads for providing connection between wire bonding leads extending from bondpads on a semiconductor die and conductors of an integrated circuit package in a one-to-one relationship. The bondpads on the semiconductor die are grouped into at least one set, the bondpads therein being substantially equidistantly spaced along a linear baseline. Each of the interconnect leads has a bondtarget at one end thereof for connection to a respective wire bonding lead and is substantially equidistantly juxtaposed from a point corresponding to the position of a respective bondpad and extending collinearly from a linear extension of the respective point to the bondtarget. The spacing between adjacent bondtargets is substantially equidistant and substantially greater than the spacing between adjacent bondpads so that the bondtargets form a set in the form of a contiguous arc. The leadframe design optimizes the positioning of the bondtargets of the leadframe in consideration of desired bond lengths and bond angles.

21 Claims, 4 Drawing Sheets

METHOD OF DESIGNING A LEADFRAME AND A LEADFRAME CREATED THEREBY

FIELD OF THE INVENTION

The present invention relates to leadframes and is particularly, but not exclusively, concerned with the design and manufacture of leadframes for an integrated circuit package.

BACKGROUND OF THE INVENTION

Typically, an integrated circuit package comprises an integrated circuit, having a combination of interconnected circuit elements inseparably associated on or within a continuous substrate referred to as a semiconductor die, the semiconductor die being encapsulated with n a ceramic or plastic package. The integrated circuit package comprises a number of connectors extending from the package for interconnection with external components upon a printed circuit board or like element. A special form of integrated circuit package, or IC, is a quad flat pack, or QFP. A QFP is a substantially square IC having numerous connectors extending from each side thereof.

To connect the semiconductor die to the connectors, it is known to provide a leadframe which extends the electrical connection from the relatively closely spaced input/outputs, terminating at bond pads, on the semiconductor die to the relatively widely spaced pads, on the semiconductor die to the relatively widely spaced connectors of the integrated circuit package. The leadframe can be considered to essentially form the skeleton of the integrated circuit package, comprising a number of closely spaced conductive interconnect leads.

In the semiconductor industry the trend has been to increase the density of integrated circuit packages, thus increasing the functionality of the IC. The technology at the semiconductor level has been advancing at a great rate in contrast to the mechanical technology involved in packaging these state-of-the-art devices. Unfortunately, the state of the mechanical technology is often the limiting factor in the obtainable density of the ICs. For example, some Very Large Scale Integration (VLSI) chips have as many as 256 interconnect leads evenly spaced around a package which is just over one inch square. This can result in the space between interconnect leads being only 0.008 inches. This presents considerable challenges as each conductive lead must be connected to a bondpad on the edge of a semiconductor which is only 0.35 to 0.45 inches square. The spacing, or pitch, between each bondpad is also very small, in the order of 0.006 inches. Thus the spacing between each conductive lead gets smaller as they approach the semiconductor.

Typically, the interconnect leads of the leadframe are made from flat sheets of copper which are photochemically treated to form a leadframe pattern thereon. The sheets of copper are then chemically etched to remove unwanted copper from between the interconnect leads. There is naturally a limit as to how small the space can be between each conductive lead and a limit as to how narrow a conductive lead can be and still be useable with current bonding techniques. A further constraint is that the angle at which the conductive lead approaches the semiconductor must substantially match the angle at which the bond wire extends therefrom in order to prevent the bond wire contacting more than one conductive lead during the bonding process.

Therefore, as QFP connector counts increase as a result of increased functionality of the integrated circuits contained therein, the internal leadframe design becomes a critical assembly yield and component quality issue. Any design optimization of the leadframe requires a trade-off between wire bond lengths to the semiconductor die, wire bond angles (i.e. the angle which a wire bonding lead and a conductive lead form) and bondtarget widths at the tip of the interconnect leads. Excessive bond lengths can result in wire shorting during molding of the integrated circuit package, while large bond angles on small bondtargets increase the probability of edge bonding which in turn will limit component assembly yields.

Thus, a disadvantage with the conventional design is that there is no direct control over desired bond lengths or bond angles. In general, the semiconductor die is not considered in the design process of the leadframe and therefore the conventional leadframe design approach does not optimize the leadframe in consideration of desired bond lengths or bond angles.

SUMMARY OF THE INVENTION

The present invention overcomes the disadvantages of conventional design techniques by providing a method of designing a leadframe which optimizes the positioning and angles of the leadtips of the lead in consideration of desired bond lengths or bond angles.

The present invention provides a leadframe which results in greater manufacturing yields and provides for greater lead counts than conventional leadframes.

Stated in other terms, the present invention is a leadframe for providing connection between a plurality of wire bonding leads extending from bondpads on a semiconductor die and a plurality of conductors of an integrated circuit package, the bondpads being grouped into at least one set, the bondpads of each set being substantially equidistantly spaced along a linear baseline of the semiconductor die, the leadframe comprising: a plurality of interconnect leads for connection to the plurality of conductors in a one-to-one relationship; each of the interconnect leads including a bondtarget at one end thereof for connection to a respective wire bonding lead, each bondtarget being substantially equidistantly juxtaposed from a point corresponding to the position of a respective one of the bondpads, and being substantially equidistantly spaced from an immediately adjacent bondtarget, the spacing between adjacent bondtargets being substantially greater than the spacing between adjacent bondpads; so that the bondtargets form a further set in the form of a contiguous arc, each of the interconnect leads having a portion thereof which is collinear with a line from the respective bondtarget to the corresponding bondpad.

Stated in yet other terms, the present invention is a method of designing a leadframe for an integrated circuit package including a semiconductor die, the semiconductor die having thereon a plurality of bondpads, the plurality of bondpads being grouped into at least one set, the bondpads of each set being substantially equidistantly spaced along a linear baseline, and the leadframe comprising a plurality of interconnect leads for connection to a plurality of conductors of the integrated circuit package in a one-to-one relationship, each of the interconnect leads including a bondtarget at one end thereof for connection to a respective wire bonding lead, each bondtarget being substantially equidistantly juxtaposed a point corresponding to the position of the respective bondpad, the spacing between adjacent bondtargets being substantially greater than the spacing between adjacent bondpads so that the bondtargets from a further set in the form of a contiguous arc, each of the interconnect leads extending collinearly from a respective wire bonding lead for a portion thereof about the respective bondtarget, the method comprising the steps of: a) defining the coordinates of each bondpad; b) selecting an inter-bondtarget pitch which is a preselected multiple greater than the bondpad pitch; c) defining the coordinates for a first bondtarget, the first bondtarget being located approximately adjacent a first reference line, which is perpendicular to the longitudinal axis of a set of bondpads, and within a predetermined distance from a corresponding first bondpad; d) determining the length of a first line, between the coordinates of the first bondtarget and the corresponding first bondpad; e) defining a circle centered at the bondtarget coordinates with a radius equal to said inter-bondtarget pitch; f) defining a line, from the coordinates of a second bondpad coordinate adjacent that of the first bondpad, which is tangential to the circle and having a length equal to that of the first line, the end of the line defining the coordinates of a second bondtarget; g) repeating steps e and f to define the coordinates of the remaining bondtargets in the set; h) comparing the position of an outermost line, which extends from an outermost bondpad coordinate to an outermost bondtarget, to the position of a second reference lien which subtends an angle of about 45° to the first reference line; i) if the position of the outermost line is farther away from the second reference line than defined by a predetermined value then increasing the inter-bondtarget pitch and repeating from step c; j) if the position of the outermost line is closer to the second reference line than defined by the predetermined value then decreasing the inter-bondtarget pitch and repeating from step c; k) else, defining a first set of interconnect leads of the plurality of interconnect leads, each interconnect lead connecting one bondtarget of the plurality of bondtargets with a respective conductor in a one-to-one relationship.

With the present invention the leadframe design optimizes the positioning of the bondtargets of the leadframe in consideration of desired bond lengths and bond angles. The spacing between adjacent bondtargets is substantially equidistant and substantially greater than the spacing between adjacent bondpads so that the bondtargets form a set in the form of a contiguous arc. Furthermore, the interconnect leads form a collinear extension of the wire bonding leads thereby reducing the possibility of edge bonding or shorting of the wire bonding leads with adjacent interconnect leads.

BRIEF DESCRIPTION OF THE DRAWINGS

The invention will be further understood from the following description, by way of example, with reference to the accompanying diagrammatic drawings in which similar references are used in the different figures to denote similar parts and in which:

FIG. 5 is a top plan view illustrating the design technique of the present invention; and FIG. 6 is an illustration representative of the design technique of the present invention.

DETAILED DESCRIPTION

Figure 1:
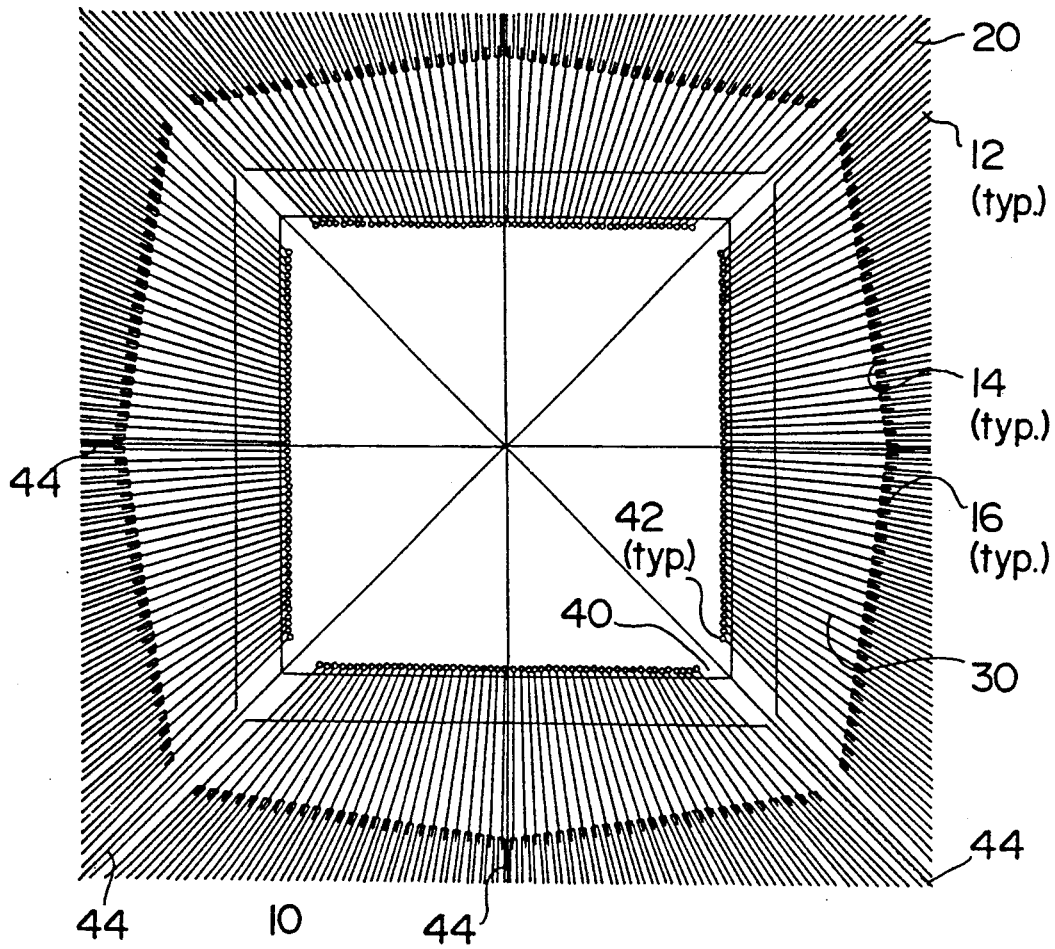
FIG. 1 is a top plan view of a leadframe according to the prior art.

FIG. 1 depicts a semiconductor die 40, as known in the art, having a plurality of bondpads 42 which are grouped into sets about sides of the semiconductor die 40. The bondpads 42 of each set are substantially equidistantly spaced along a common baseline (not shown). Symmetrically surrounding the semiconductor die 40 is a leadframe 10, as is commonly known in the prior art. The leadframe 10 comprises a plurality of electrically conductive interconnect leads 12 which radiate out from the semiconductor die 40 to the connectors (not shown) of the integrated circuit package (also not shown) upon which the leadframe 10 is placed. As stated above, the purpose of the leadframe 10 is to extend the electrical connection from the relatively closely spaced bondpads 42 of the semiconductor die 40 to the relatively widely spaced connectors of the integrated circuit package. The interconnect leads 12 of the leadframe 10 are interconnected to the bondpads 42 by way of wire bonding leads 30 extending from the bondpads 42 to the bondtargets 16 of the interconnect leads 12. The wire bonding leads 30 ar mechanically and electrically coupled to the bondpads 42 and the bondtargets 16 by convention wire bonding methods, such as thermosonic welding.

As is readily apparent from FIG. 1 the symmetrical array formed by the interconnect leads 12 about the semiconductor die 40 is discontinuous about the center lines 44 of the semiconductor die 40. Moreover, it is to be noted that the wire bonding leads 30 extend for a greater distance from the center of the semiconductor die 40 than from the corners of the semiconductor die 40. Furthermore, the spacing between each of the bondtargets 16 is unequal, and the bonding angles vary from the corners to the center of the semiconductor die 40 and can be as much as 15°.

Due to these variations, the complexity of designing the leadframe 10 is increased. It is a relatively difficult exercise to define the actual location of the bondtargets 16 for placement of the wire bonding leads 30 by the techniques common in the art.

A further consequence of the prior art design, due to the variation in lengths of the wire bonding leads 30 and the spacing between bondtargets 16, is that the amount of work necessary to set up and optimize the equipment which performs the actual wire bonding is also increased as variables as to wire bonding lead 30 length and inter-bondtarget pitch must be programmed into the equipment.

Figure 2:
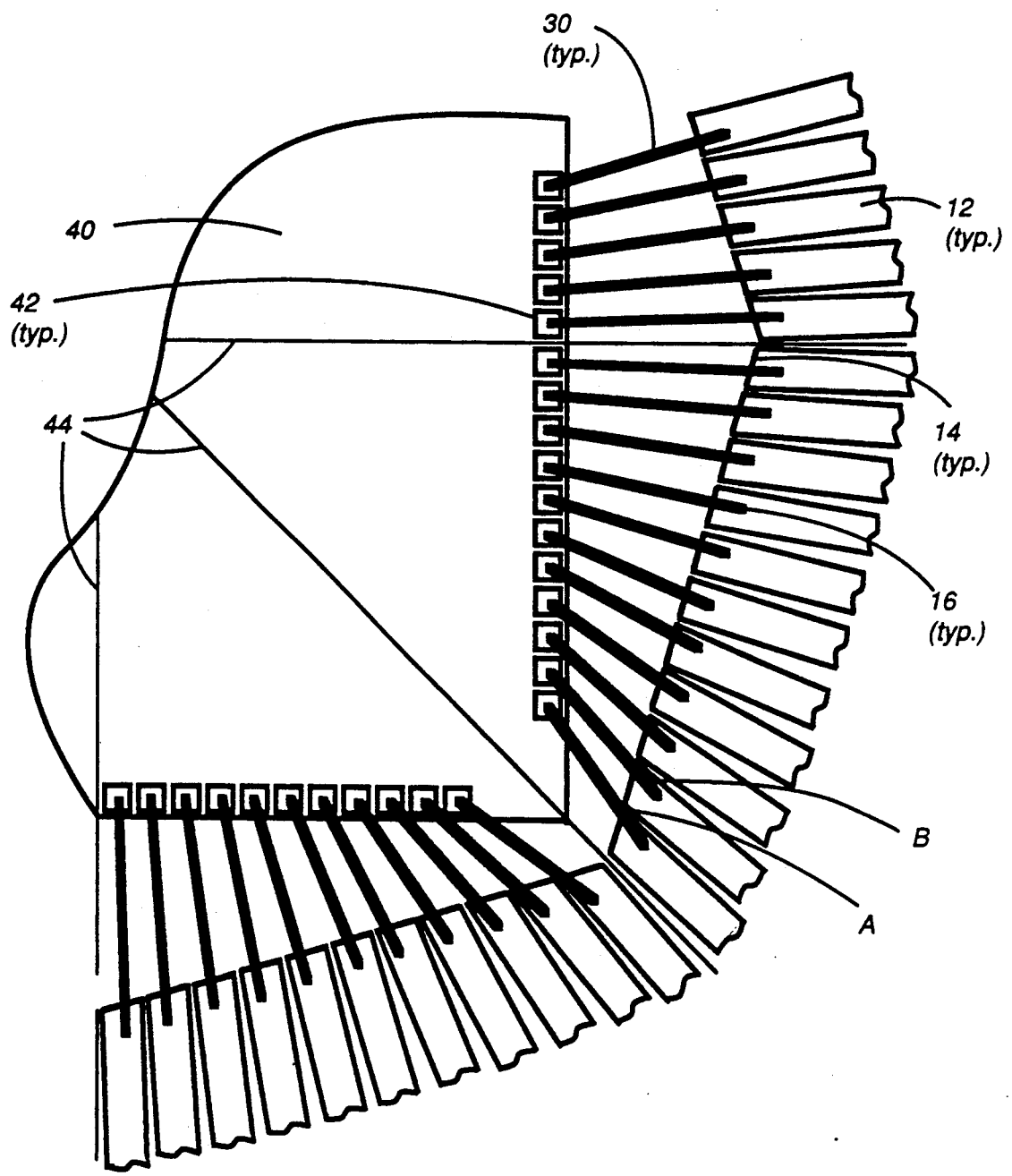
FIG. 2 is a top plan view of a portion of the leadframe of FIG. 1 illustrating a potential problem which can occur with prior art designs.
Figure 3:
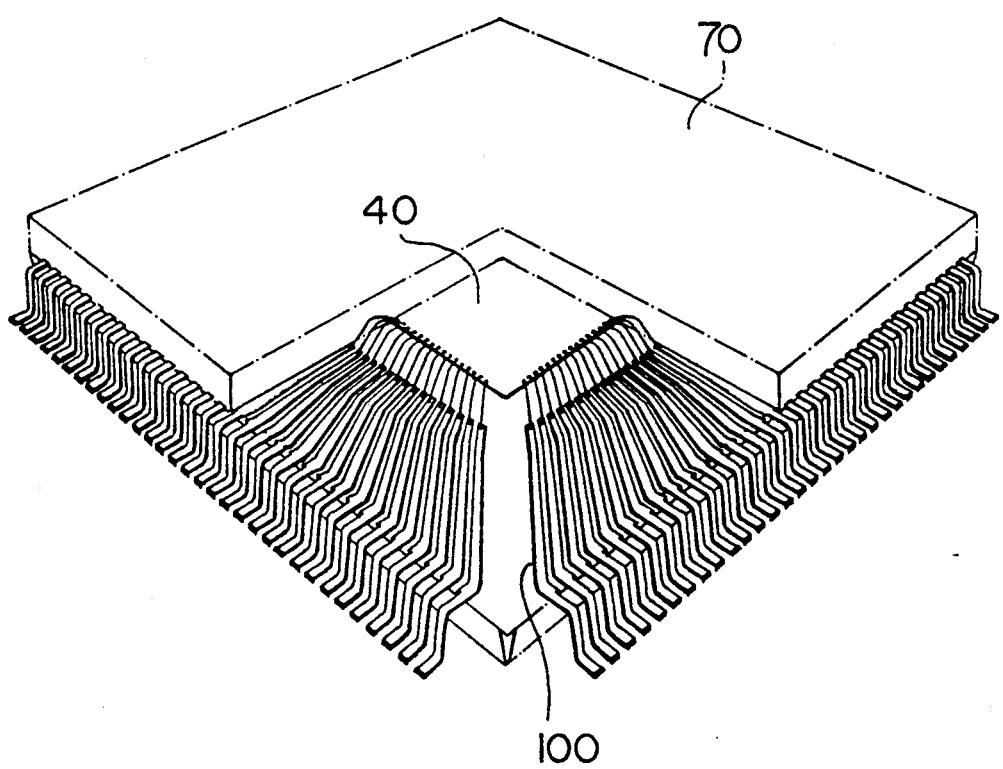
FIG. 3 is an isometric view of a quad flat pack having a leadframe, according to the present invention, therein.

FIG. 2 illustrates a more serious consequence which can result with the prior art design as illustrated in FIG. 1. Due to the resultant relatively large bonding angles it is possible that a wire bonding lead 30 will contact an adjacent interconnect lead 12 thereby creating an electrical short, as illustrated at A. It is also possible that the wire bonding leads 30 will be bonded on edges of the interconnect leads 12, as illustrated at B. Either problem will result in reduced component assembly yields.

A further consequence of the prior art design is that the varying length of wire bonding leads 30 can result in varying signal delays which, in certain instances, can be undesirable.

The present invention, as described below, overcomes the problems experienced in the prior art by providing a leadframe having bondtarget positions which are optimized in relation to the desired wire bonding lengths and wire bonding angles required for manufacturing.

Figure 4:
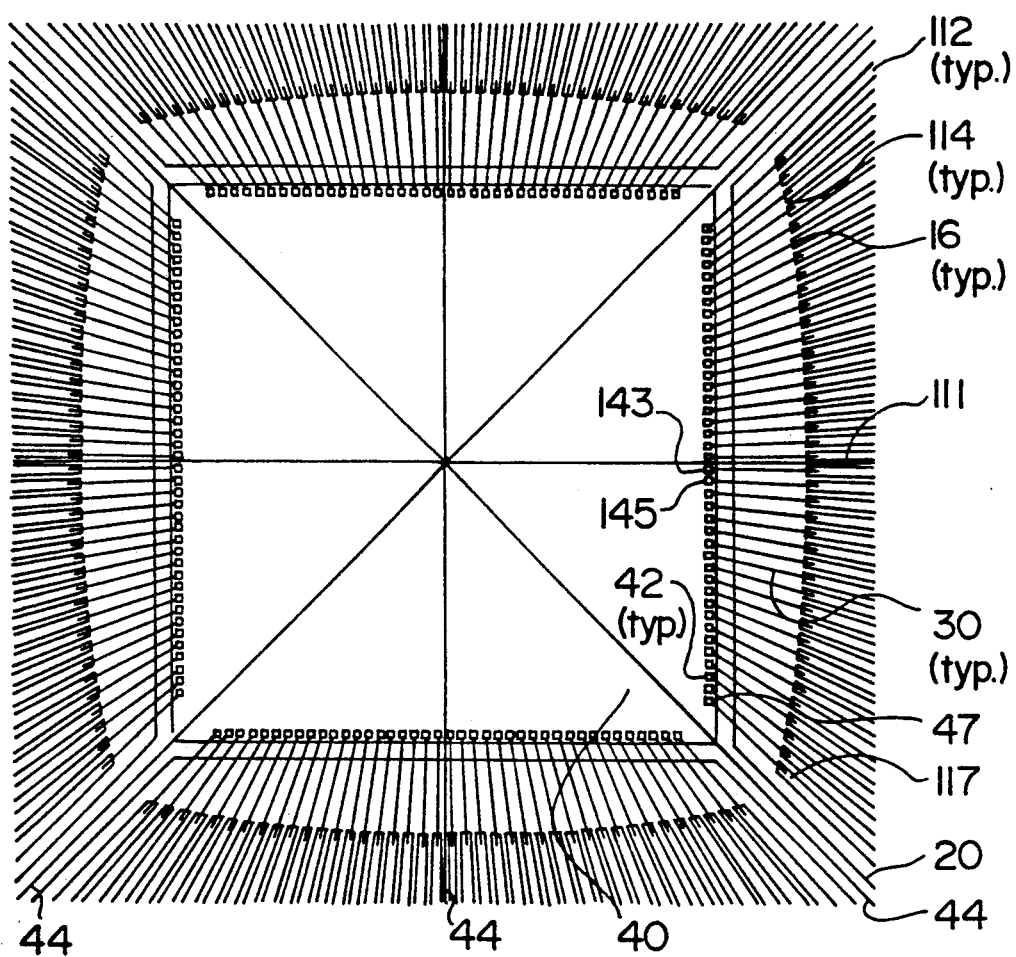
FIG. 4 is a top plan view of a leadframe according to the present invention.

In FIG. 4 it is apparent that the leadframe 100 also forms a symmetrical array about the semiconductor die 40. However, the array is continuous about the vertical and horizontal center lines of the semiconductor die 40, forming a continuous arc about the side of the semiconductor die 40. With this design, the wire bonding leads 30 are of equal length, thus simplifying bonding equipment setup and ensuring that all signal delays are substantially equal. The primary advantage of the leadframe 100 is that each of the wire bonding leads 20 terminates on a respective interconnect lead 112 substantially collinear wit the interconnect lead 112 (i.e. the bond angles are substantially 0°). Thus the possibility of wire bonding lead 30 shorting adjacent interconnect leads 112 or bonding to an edge of an interconnect lead 112 is virtually eliminated. Furthermore, the pitch, or spacing, between each of the bondtargets 116 is equal, thus producing equal bond flat widths (i.e. the width of the bond of the wire bonding lead 30 to the bondtarget 116) for the wire bonding leads 30 and simplifying the assembly of the leadframe 100 to the semiconductor die 40.

FIG. 5 helps to illustrate the design of leadframe 100 in greater detail. In FIG. 5, a series of bondpad coordinates 66 are depicted which would correspond to the placement of the bondpads 42 along a side of the semiconductor die 40. Bondtargets 116 are shown lying upon a non-linear baseline 50 which approximates the location of the bondtargets 116 in relation to the semiconductor die 40. As can be seen, the wire bonding leads 30 are of equal length y and are collinear with the interconnect leads 112. With the wire bonding leads 30 being of equal length, the possibility of shorting between the wire bonding leads 30 during encapsulation of the semiconductor die 40, leadframe 100, and wire bonding leads 30 is reduced, thus further increasing product yields.

With further reference in FIG. 6, the method of designing a leadframe 100, according to the present invention as depicted in FIG. 4, comprises the following steps:

a) defining the coordinates of each bondpad 42 of a given semiconductor die 40;
b) selecting an inter-bondtarget pitch x (as shown in FIG. 5) which is a preselected multiple greater than the bondpad pitch—typically, the initial inter-bondtarget pitch selection is approximately two times the bondpad pitch;
c) defining the coordinates for a first bondtarget 111, the first bondtarget 111 being located approximately ½ the inter-bondtarget pitch (i.e. ½x) from a reference line 122, which is perpendicular to the longitudinal axis of a set of bondpads 42, i.e. linear baseline 46, and within a predetermined distance from a corresponding first bondpad 43;
d) determining the length of a first line 31, which corresponds to the position of a first wire bonding lead 30, between the coordinates of the first bondtarget 111 and the corresponding first bondpad 43;
e) defining a circle 62 centered at the bondtarget coordinates 111 with a radius R equal to the selected inter-bondtarget pitch X;
f) defining a line 33, corresponding to the position of a second wire bonding lead 30, from the coordinates of a second bondpad coordinate 45, adjacent that of the first bondpad 43, which is tangential (as at point 21) to the circle 62 and having a length equal to that of the first line 31, the end of the line 33 defining the coordinates of a second bondtarget 113;
g) repeating steps e and f to define the coordinates of the remaining bondtargets 116 in the set;
h) determining the distance from an outermost bondtarget coordinate 117 to the tiebar 20 (refer to FIG. 4—the tiebar 20 being collinear with a centre line of the semiconductor die);
i) if the distance is larger than a predetermined value (e.g. 10 mils) then the value of the inter-bondtarget pitch is increased and the method is repeated from step c;
j) if the distance is smaller than the predetermined value then the value of the inter-bondtarget pitch is decreased and the method is repeated from step c;
k) otherwise, a first set of interconnect leads 112 is defined, each of the interconnect leads 112 connecting one bondtarget 116 of the plurality of bondtargets 112 with a respective conductor (not shown) in a one-to-one relationship;
l) mirroring the first set of interconnect leads 112 about the reference line 122, thereby creating a set of interconnect leads substantially forming a continuous arc about one side of the semiconductor die 40; and
m) mirroring the set of interconnect leads creating in step 1 about the remaining center lines 44 thereby creating the symmetrical array about the semiconductor die 40 as depicted in FIG. 4.

An alternative to the above method is to replace step f as described above with the following step f:

f) defining a line 35, from the coordinates of a second bondpad coordinate 45 adjacent that of the first bondpad 43, having a length equal to that of the first line 31, the end of the line 33 intersecting the circle 62 at a point 115.

Either method can be used to define the location of all the bondtargets 116, and the respective interconnect leads 112, of the leadframe 100. However, the former method is preferred as it results in an equal perpendicular pitch between each of the interconnect leads 112 which at present is required by leadframe etching vendors.

A further alternative to the above method is to replace steps h–j as described above with the following steps h–j:

h) determining the angle subtended by an outermost line 49 (not shown in FIG. 6), which corresponds to the position of the outermost wire bonding lead 30 and which extends from an outermost bondpad coordinate 47 to an outermost bondtarget coordinate 117, and the center line 44 which is at 45° to the horizontal;
i) if the angle is larger than a predetermined value (e.g. 2°) then the value of the inter-bondtarget pitch is increased and the method is repeated from step c;
j) if the angle is smaller than the predetermined value then the value of the inter-bondtarget pitch is decreased and the method is repeated from step c.

Again, either method can be used to design the leadframe 100. However, the former method is preferred as it optimizes the leadframe 100 design in relation to the actual tiebar 20.

Typically the semiconductor die 40 is square with the sets of interconnect leads 112 about each side of the semiconductor die 40 subtending an angle of substantially 90°. However, the method is also effective for designing leadframes about rectangular semiconductor dies wherein orthogonal sets of interconnect leads subtend angles greater and less than 90° respectively. Therefore, for rectangular semiconductor dies 40 step m would be replaced with the following steps m and n:

m) Mirroring the set of interconnect leads created in step 1 and a centre line perpendicular to the reference line and spacing the mirrored set of interconnect leads an equidistant amount from the side of the semiconductor die as the original set of interconnect leads.

n) Repeating steps a–m for the remaining two sides of the semiconductor die.

Numerous other modifications, variations, and adaptations may be made to the particular embodiments of the invention described above without departing from the scope of the claims.

I claim:

1. A leadframe for providing connection between a plurality of wire bonding leads extending from bondpads on a semiconductor die and a plurality of conductors of an integrated circuit package, the bondpads being grouped into at least one set, the bondpads of each set being substantially equidistantly spaced along a linear baseline of the semiconductor die, the leadframe comprising:

a plurality of interconnect leads for connection to the plurality of conductors in a one-to-one relationship;

each of the interconnect leads including a bondtarget at one end thereof for connection to a respective wire bonding lead, each bondtarget being substantially equidistantly juxtaposed from a point corresponding to the position of a respective one of the bondpads, and being substantially equidistantly spaced form an immediately adjacent bondtarget, the spacing between adjacent bondtargets being substantially greater than the spacing between adjacent bondpads; so that the bondtargets form a further set in the form of a contiguous arc, each of the interconnect leads having a portion thereof which is collinear with a line from the respective bondtarget to the corresponding bondpad.

2. A leadframe as claimed in claim 1 wherein each of the sets of bondtargets forms a symmetrical array, subtending an angle of about 90°, about respective sets of bondpads disposed along each side of the semiconductor die, the semiconductor die being substantially square and substantially centrally located with respect to the leadframe.

3. An integrated circuit package comprising:
an insulating substrate;
a semiconductor die mounted on the insulating substrate and having a plurality of bondpads grouped into at lest one set, the bondpads of each set being substantially equidistantly spaced along a linear baseline of the semiconductor die;
a leadframe on the insulating substrate, the leadframe having a plurality of interconnect leads for connection to a plurality of conductors in a one-to-one relationship;
each of the interconnect leads including a bondtarget at one end thereof, each bondtarget being equidistantly juxtaposed from a respective one of the bondpads, the spacing between adjacent bondtargets being substantially equidistance and substantially greater than the spacing between adjacent bondpads; so that the bondtargets form a further set in the form of a contiguous arc, each of the interconnect leads having a portion thereof which is collinear with a line from the respective bondtarget to the corresponding bondpad; and a plurality of wire bonding leads, each wire bond lead being of substantially equal length and being connected at one end to one of the bondpads and at the other end to the corresponding one of the bondtargets in a one-to-one relationship.

4. An integrated circuit package as claimed in claim 3 wherein the semiconductor die is substantially square and is substantially centrally mounted on a substrate of the integrated circuit package, the plurality of bondpads forming an array about the periphery of the semiconductor die, and each of the sets of bondtargets forms a symmetrical array about respective sets of bondpads, each set of bondtargets subtending an angle of about 90°.

5. A method of designing a leadframe for an integrated circuit package including a semiconductor die, the semiconductor die having thereon a plurality of bondpads, the plurality of bondpads being grouped into at lest one set, the bondpads of each set of bondpads being substantially equidistantly spaced along a linear baseline, and the leadframe comprising a plurality of interconnect leads for connection to a plurality of conductors of the integrated circuit package in a one-to-one relationship, each of the interconnect leads including a bondtarget at one end thereof for connection to a respective wire bonding lead, each bondtarget being substantially equidistantly juxtaposed from a point corresponding to the position of a respective one of the bondpads, the spacing between adjacent bondtargets being substantially greater than the spacing between adjacent bondpads so that the bondtargets form a further set in the form of a contiguous arc, each of the interconnect leads having a portion thereof which is collinear with a line from the respective bondtarget to the corresponding bondpad, the method comprising the steps of:

a) defining the coordinates of each bondpad;
b) selecting an inter-bondtarget pitch which is a preselected multiple greater than the bondpad pitch;
c) defining the coordinates for a first bondtarget, the first bondtarget being located approximately adjacent a first reference line, which is perpendicular to the longitudinal axis of a set of bondpads, and within a predetermined distance from a corresponding first bondpad;
d) determining the length of a first line, between the coordinates of the first bondtarget and the corresponding first bondpad;
e) defining a circle entered at the bondtarget coordinates with a radius equal to said inter-bondtarget pitch;
f) defining a line, from the coordinates of a second bondpad coordinate adjacent that of the first bondpad, which is tangential to the circle and having a length equal to that of the first line, the end of the line defining the coordinates of a second bondtarget;

g) repeating steps e and f to define the coordinates of the remaining bondtargets in the set;

h) comparing the position of an outermost line, which extends from an outermost bondpad coordinate to an outermost bondtarget, to the position of a second reference line which subtends an angle of about 45° to the first reference line;

i) if the position of the outermost line is farther away from the second reference line than defined by a predetermined value then increasing the inter-bondtarget pitch and repeating from step c;

j) if the position of the outermost line is closer to the second reference line than defined by the predetermined value then decreasing the inter-bondtarget pitch and repeating from step c;

k) else, defining a first set of interconnect leads of the plurality of interconnect leads, each interconnect lead connecting one bondtarget of the plurality of bondtargets with a respective conductor in a one-to-one relationship.

6. A method of designing a leadframe as claimed in claim 5 wherein the predetermined value is a predetermined distance from the outermost bondtarget to the second reference line.

7. A method of designing a leadframe as claimed in claim 6 wherein the step of defining each inter connect lead comprises defining a segment of each inter connect lead which extends substantially from a respective bondtarget coordinate, collinearly with a line extending from a corresponding bondpad to the respective bondtarget.

8. A method as claimed in claim 7 in which the first reference lien is a center line of the set of bondpads and further comprises the step of mirroring the first set of interconnect leads about the center line to obtain a second set of interconnect leads which together define a symmetrical array.

9. A method as claimed in claim 8 further comprising the step of mirroring, about remaining semiconductor die center lines, the first and second set of interconnect leads to thereby create a further symmetrical array about the remaining semiconductor die center lines thereby creating a bondtarget area symmetrically surrounding the semiconductor die.

10. A method as claimed in claim 9 wherein the semiconductor die is substantially square and is substantially centrally mounted on a substrate of the integrated circuit wherein the step of mirroring the first and second set of interconnect leads forms a symmetrical array of interconnect leads about respective sets of bondpads in which each set of bondtargets subtends an angle of about 90°.

11. A method of designing a leadframe as claimed in claim 5 wherein the predetermined value is a predetermined subtended angle between the outermost line and the second reference line.

12. A method of designing a leadframe as claimed in claim 11 wherein the step of defining each interconnect lead comprises defining a segment of each interconnect lead which extends substantially from a respective bondtarget coordinate, collinearly with a line extending from a corresponding bondpad to the respective bondtarget.

13. A method as claimed in claim 12 in which the first reference line is a center line of the set of bondpads and further comprises the step of mirroring the first set of interconnect leads about the center line to obtain a second set of interconnect leads which together define a symmetrical array.

14. A method as claimed in claim 13 further comprising the step of mirroring, about remaining semiconductor die center lines, the first and second set of interconnect leads to thereby create a further symmetrical array about the remaining semiconductor die center lines thereby creating a bondtarget area symmetrically surrounding the semiconductor die.

15. A method as claimed in claim 14 wherein the semiconductor die is substantially square and is substantially centrally mounted on a substrate of the integrated circuit wherein the step of mirroring the first and second set of interconnect leads forms a symmetrical array of interconnect leads about respective sets of bondpads in which each set of bondtargets subtends an angle of about 90°.

16. A method of designing a leadframe for an integrated circuit package including a semiconductor die, the semiconductor die having thereon a plurality of bondpads, the plurality of bondpads being grouped into at least one set, the bondpads of each set of bondpads being substantially equidistantly spaced along a linear baseline, and the leadframe comprising a plurality of interconnect leads for connection to a plurality of conductors of the integrated circuit package in a one-to-one relationship, each of the interconnect leads including a bondtarget at one end thereof for connection to a respective wire bonding lead, each bondtarget being substantially equidistantly juxtaposed from a point corresponding to the position of a respective one of the bondpads, the spacing between adjacent bondtargets being substantially greater than the spacing between adjacent bondpads so that the bondtargets form a further set in the form of a contiguous arc, each of the interconnect leads having a portion thereof which is collinear with a line from the respective bondtarget to the corresponding bondpad, the method comprising the steps of:

a) defining the coordinates of each bondpad;

b) selecting an inter-bondtarget pitch which is a preselected multiple greater than the bondpad pitch;

c) defining the coordinates for a first bondtarget, the first bondtarget being located approximately adjacent a first reference line, which is perpendicular to the longitudinal axis of a set of bondpads, and within a predetermined distance from a corresponding first bondpad;

d) determining the length of a first line, between the coordinates of the first bondtarget and the corresponding first bondpad;

e) defining a circle entered at the bondtarget coordinates with a radius equal to said inter-bondtarget pitch;

f) defining a line, from the coordinates of a second bondpad coordinate adjacent that of the first bondpad, having a length substantially equal to that of the first line, the end of the line intersecting the circle at the coordinates of a second bondtarget;

g) repeating steps e and f to define the coordinates of the remaining bondtargets in the set;

h) comparing the position of an outermost line, which extends from an outermost bondpad coordinate to an outermost bondtarget, to the position of a second reference line which subtends an angle of about 45° to the first reference line;

i) if the position of the outermost line is farther away from the second reference line than defined by a predetermined value then increasing the inter-bondtarget pitch and repeating from step c;

j) if the position of the outermost line is closer to the second reference line than defined by the predetermined value then decreasing the inter-bondtarget pitch and repeating from step c;

k) else, defining a first set of interconnect leads of the plurality of interconnect leads, each interconnect lead connecting one bondtarget of the plurality of bondtargets with a respective conductor in a one-to-one relationship.

17. A method of designing a leadframe as claimed in claim 16 wherein the predetermined value is a predetermined distance from the outermost bondtarget to the second reference line.

18. A method of designing a leadframe as claimed in claim 17 wherein the step of defining each interconnect lead comprises defining a segment of each interconnect lead which extends substantially from a respective bondtarget coordinate, collinearly with a line extending from a corresponding bondpad to the respective bondtarget.

19. A method as claimed in claim 18 in which the first reference line is a center line of the set of bondpads and further comprises the step of mirroring the first set of interconnect leads about the center line to obtain a second set of interconnect leads which together define a symmetrical array.

20. A method as claimed in claim 19 further comprising the step of mirroring, about remaining semiconductor die center lines, the first and second set of interconnect leads to thereby create a further symmetrical array about the remaining semiconductor die center lines thereby creating a bondtarget area symmetrically surrounding the semiconductor die.

21. A method as claimed in claim 20 wherein the semiconductor die is substantially square and is substantially centrally mounted on a substrate of the integrated circuit wherein the step of mirroring the first and second set of interconnect leads forms a symmetrical array of interconnect leads about respective sets of bondpads in which each set of bondtargets subtends an angle of about 90°.

* * * * *